United States Patent
Sandhu et al.

(10) Patent No.: US 6,606,802 B2
(45) Date of Patent: Aug. 19, 2003

(54) CLEANING EFFICIENCY IMPROVEMENT IN A HIGH DENSITY PLASMA PROCESS CHAMBER USING THERMALLY HOT GAS

(75) Inventors: Gurtej S. Sandhu, Boise, ID (US); Michael Li, Boise, ID (US); Neal R. Rueger, Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/998,078

(22) Filed: Nov. 30, 2001

(65) Prior Publication Data

US 2003/0101613 A1 Jun. 5, 2003

(51) Int. Cl.[7] .................................................. F26B 3/00
(52) U.S. Cl. .............................. 34/448; 34/85; 34/230; 34/232
(58) Field of Search .............................. 34/448, 85, 92, 34/218, 230, 232

(56) References Cited

U.S. PATENT DOCUMENTS

| | | | |
|---|---|---|---|
| 5,158,644 A | * 10/1992 | Cheung et al. | 438/694 |
| 5,788,799 A |   8/1998 | Steger et al. | 156/345 |
| 5,843,239 A | * 12/1998 | Shrotriya | 134/1.1 |
| 5,911,834 A | *  6/1999 | Fairbairn et al. | 134/1.3 |
| 6,083,344 A | *  7/2000 | Hanawa et al. | 156/345.28 |
| 6,095,158 A | *  8/2000 | Shugrue | 134/1 |
| 6,109,206 A |   8/2000 | Maydan et al. | 117/723 |
| 6,136,211 A |  10/2000 | Qian et al. | 216/37 |
| 6,199,506 B1 |   3/2001 | Hilliker et al. | 118/723 |
| 6,200,412 B1 |   3/2001 | Kilgore et al. | 156/345 |
| 6,294,466 B1 | *  9/2001 | Chang | 438/680 |

* cited by examiner

Primary Examiner—Ira S. Lazarus
Assistant Examiner—Kathryn S. O'Malley
(74) Attorney, Agent, or Firm—Whyte Hirschboeck Dudek SC

(57) ABSTRACT

Method and apparatus are disclosed for improving the cleaning efficiency of a high density plasma system by introducing thermally hot gases to heat downstream chamber walls to improve the fluorine attack on deposit coatings. In certain embodiments of the invention, the cleaning gas and thermally hot gas are allowed into the region of the high vacuum pump to provide cleaning of the high vacuum pump.

64 Claims, 2 Drawing Sheets

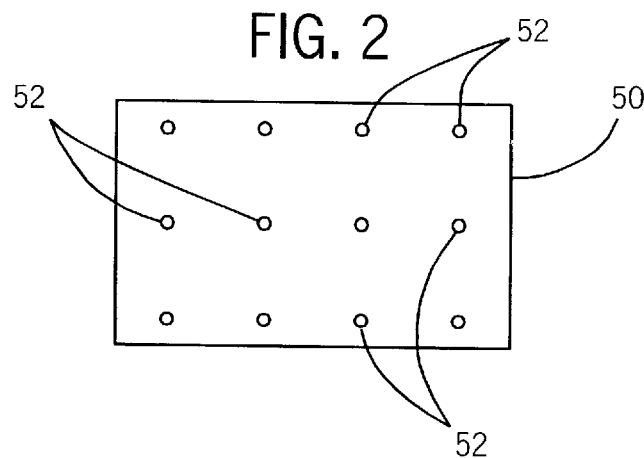
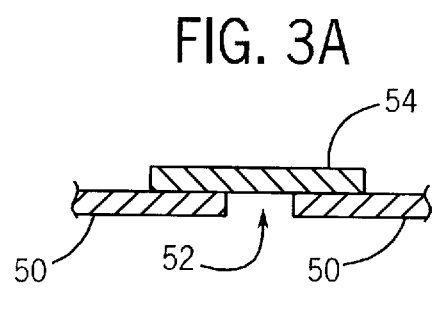
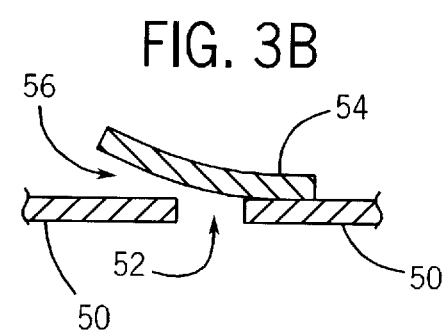
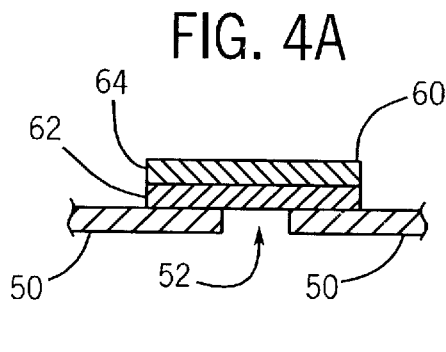
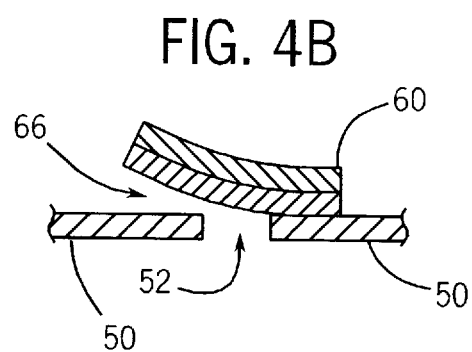

CLEANING EFFICIENCY IMPROVEMENT IN A HIGH DENSITY PLASMA PROCESS CHAMBER USING THERMALLY HOT GAS

BACKGROUND OF THE INVENTION

This invention relates generally to semiconductor production processes, and more specifically to methods and apparatus for cleaning plasma process systems.

High density plasma chambers are used in a number of semiconductor processing steps including silicon-dioxide deposition processes and high energy etching processes. Whether used for deposition or etching, the sides of the plasma chamber eventually become coated with the material being deposited or etched. Subsequently, the material on the chamber sides may loosen from the sides and form particulates that present a contamination concern for the semiconductors being processed. As such, the high-density plasma chambers must be periodically cleaned.

High density plasma chambers are frequently cleaned by introducing a cleaning gas, such as disassociated fluorine, into the plasma chamber. The cleaning process may be augmented by striking a plasma in the plasma chamber during cleaning. However, even when a plasma is used during cleaning, the cleaning efficiency for surfaces downstream of the plasma is significantly less than for the surfaces in the vicinity of the plasma. As a result, longer cleaning cycles are required to fully clean the chamber surfaces. Therefore, a method of cleaning a plasma chamber that increases the cleaning efficiency for areas downstream of the plasma zone is desirable for semiconductor processing systems.

BRIEF SUMMARY OF THE INVENTION

A method of cleaning a high density plasma system is disclosed, the method comprising the steps of providing a high density plasma system comprising a process chamber having a wafer chuck disposed therein, a flow channel providing fluid communication between the process chamber and a high vacuum pump such that the process chamber and the flow channel are connected to form a continuous inner surface, wherein the flow channel comprises a valve disposed between the process chamber and the high vacuum pump; introducing a hot gas into the system between the wafer and the valve such that the inner surface between the wafer and the valve is heated; and introducing a cleaning gas into the system such that deposits located on the heated inner surface are substantially removed.

In accordance with one aspect of the invention, a method of cleaning a high density plasma system is disclosed. The method comprising the steps of: providing a high density plasma system comprising a process chamber having a wafer chuck disposed therein, a flow channel providing fluid communication between the process chamber and a high vacuum pump such that the process chamber and the flow channel are connected to form a continuous inner surface, wherein the flow channel comprises a valve disposed between the process chamber and the high vacuum pump; introducing a hot gas into the system between the wafer and the valve such that the inner surface between the wafer and the valve is heated; and introducing a cleaning gas into the system such that deposits located on the heated inner surface are substantially removed, wherein the valve is closed.

In accordance with another aspect of the invention a method of cleaning a high density plasma system is disclosed, the method comprising the steps of: providing a high density plasma system comprising a process chamber having a wafer chuck disposed therein, a flow channel providing fluid communication between the process chamber and a high vacuum pump such that the process chamber and the flow channel are connected to form a continuous inner surface, the process chamber being disposed upstream of the high vacuum pump, wherein the flow channel comprises a valve disposed between the process chamber and the high vacuum pump; closing the valve such that fluid communication between the process chamber and the high vacuum pump is interrupted; introducing a hot gas into the system between the wafer and the valve such that the inner surface between the wafer and the valve is heated; introducing a cleaning gas into the system such that deposits located on the heated inner surface are substantially removed; introducing a cleaning gas into the system downstream of the closed valve such that deposits located on the high vacuum pump are substantially removed.

In accordance with yet another aspect of the invention a method of cleaning a high density plasma system is disclosed, the method comprising the steps of: providing a high density plasma system comprising a process chamber having a wafer chuck disposed therein, a flow channel providing fluid communication between the process chamber and a high vacuum pump such that the process chamber and the flow channel are connected to form a continuous inner surface, the process chamber being disposed upstream of the high vacuum pump, wherein the flow channel comprises a valve disposed between the process chamber and the high vacuum pump; setting the valve in an open position such that fluid communication between the process chamber and the high vacuum pump is permitted; introducing a hot gas into the system between the wafer and the valve such that the inner surface between the wafer and the valve is heated; and introducing a cleaning gas into the system such that deposits located on the heated inner surface are substantially removed and deposits located on the high vacuum pump are substantially removed.

In yet another aspect of the invention a method of cleaning a high density plasma system is disclosed, the method comprising the steps of providing a high density plasma system comprising a process chamber having a wafer chuck disposed therein, a flow channel providing fluid communication between the process chamber and a high vacuum pump such that the process chamber and the flow channel are connected to form a continuous inner surface, the process chamber being disposed upstream of the high vacuum pump, wherein the flow channel comprises a gate valve disposed between the process chamber and the high vacuum pump, wherein the gate valve has a valve blade comprising at least one orifice having an electromechanical valve attached to the blade upstream of and positioned over the orifice, the electromechanical valve having an open position permitting fluid communication through the orifice and a closed position preventing fluid communication through the orifice; closing the gate valve such that the valve blade interrupts fluid communication between the process chamber and the high vacuum pump; introducing a hot gas into the system between the wafer and the gate valve such that the inner surface between the wafer and the gate valve is heated; introducing a cleaning gas into the system such that deposits located on the heated inner surface are substantially removed; positioning the electromechanical valve into an open position such that the cleaning gas is introduced into the system downstream of the closed gate valve such that deposits located on the high vacuum pump are substantially removed.

An apparatus is disclosed for processing substrates comprising a process chamber having a wafer chuck disposed therein; a high vacuum pump; a flow channel providing fluid communication between the process chamber and the high vacuum pump such that the process chamber and the flow channel are connected to form a continuous inner surface, the process chamber being disposed upstream of the high vacuum pump, wherein the flow channel comprises a valve disposed between the process chamber and the high vacuum pump; a first inlet between the wafer and the valve, the first inlet connected to a source of a hot gas; and a second inlet connected to a source of a cleaning gas.

An apparatus is disclosed for processing substrates, comprising a process chamber having a wafer chuck disposed therein; a high vacuum pump; a flow channel providing fluid communication between the process chamber and the high vacuum pump such that the process chamber and the flow channel are connected to form a continuous inner surface, the process chamber being disposed upstream of the high vacuum pump, wherein the flow channel comprises a valve disposed between the process chamber and the high vacuum pump; a first inlet between the wafer and the valve, the first inlet connected to a source of a hot gas; a second inlet connected to a source of a cleaning gas; and a third inlet downstream of the valve, the third inlet connected to a source of a cleaning gas.

An apparatus is disclosed for processing substrates, comprising a process chamber having a wafer chuck disposed therein; a high vacuum pump; a flow channel providing fluid communication between the process chamber and the high vacuum pump such that the process chamber and the flow channel are connected to form a continuous inner surface, the process chamber being disposed upstream of the high vacuum pump, a gate valve disposed in the flow channel between the process chamber and the high vacuum pump wherein the gate valve has a valve blade comprising at least one orifice having an electromechanical valve movably attached to the blade upstream of and positioned over the orifice, the electromechanical valve having an open position permitting fluid communication through the orifice and a closed position preventing fluid communication through the orifice, a first inlet between the wafer and the gate valve, the inlet connected to a source of a hot gas; and a second inlet connected to a source of a cleaning gas.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

FIG. 2 is a top view of a modified gate valve blade.

FIG. 3 is a side cross sectional view of the modified gate valve blade of FIG. 2.

FIGS. 4 A and B is a side cross sectional view of a different embodiment of the modified gate valve blade of FIG. 2.

DETAILED DESCRIPTION OF THE INVENTION

Figure 1:
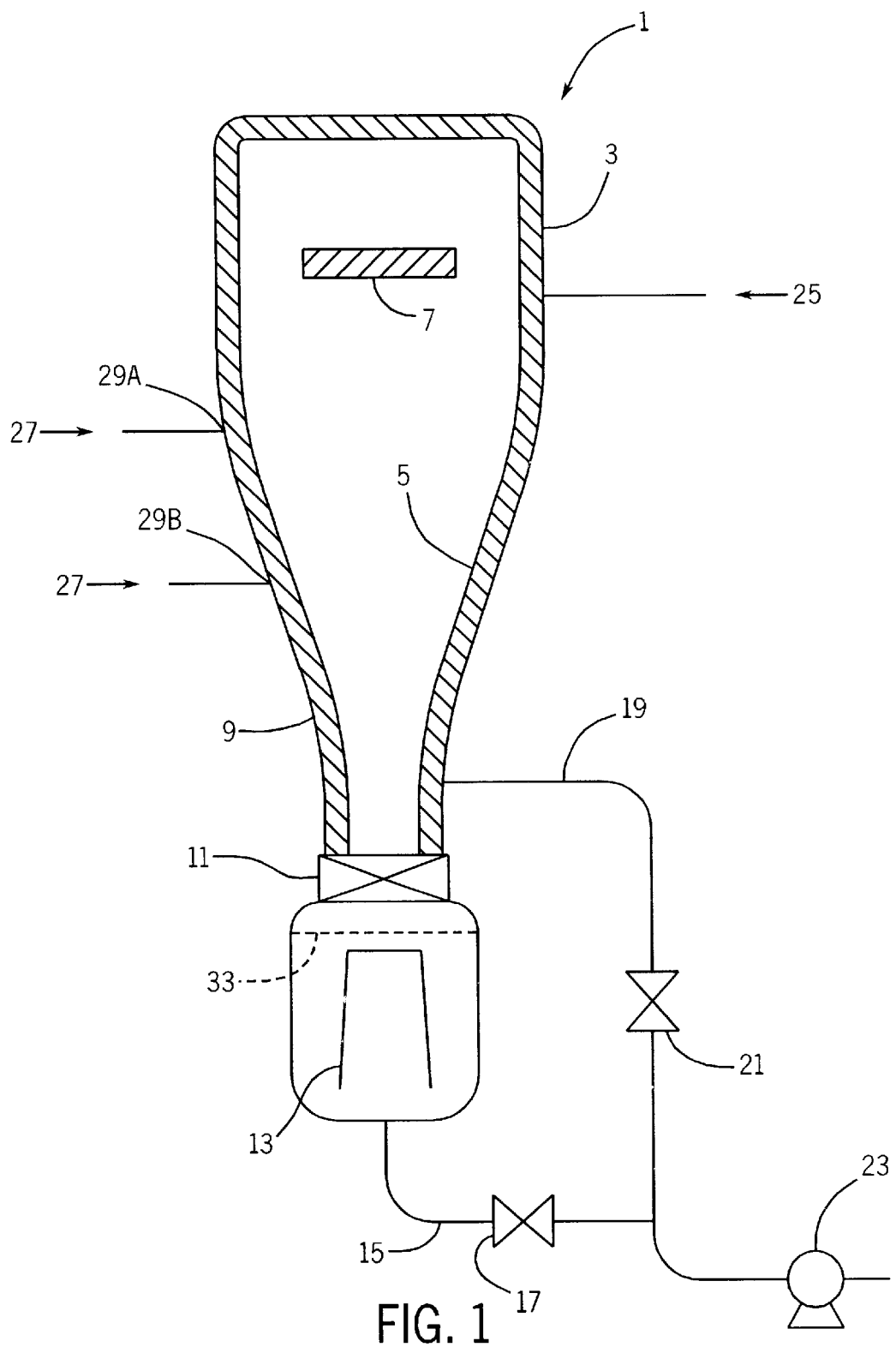
FIG. 1 is a schematic view of a plasma process system.

The terms "wafer" or "substrate" used in the following description include any semiconductor-based structure having a silicon surface. Wafer and substrate are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when references made to a wafer or substrate in the following description, previous process steps may have been used to form regions or junctions in the base semiconductor structure or foundation.

In the following detailed description, references made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural or electrical changes may be made without departing from the spirit and scope of the present invention.

FIG. 1 shows a schematic view of a plasma process system such as commonly used in the semiconductor industry. Plasma system 1 comprises a process chamber 3 having interior walls 5. Process chamber 3 encloses a wafer chuck 7. A "wafer chuck" is used herein to denote any mounting structure suitable for holding a wafer during processing. Exhaust port 9 connects process chamber 3 with a vacuum stack. The vacuum stack comprises a high vacuum pump 13 which is typically either a cryopump or a turbomolecular pump. As used herein, a "high vacuum pump" is a pump that can generate a high vacuum, i.e., very low pressures. The high vacuum pump 13 may be isolated from exhaust port 9 by means of valve 11 which is typically a gate valve. Foreline 15 connects high vacuum pump 13 with roughing line 19. Valve 17 on foreline 15 is used to isolate the foreline. Roughing line 19 provides communication from the plasma system 1 to roughing pump 23. Roughing line 19 may be isolated by means of valve 21.

As shown in FIG. 1, the system comprises a flow channel comprising exhaust port 9 and typically including the lower sections of chamber 3, the foreline 15, the valve 11 and roughing line 19.

During operation of a system as shown in FIG. 1, a plasma is imposed in the region immediately above (upstream) of the wafer chuck 7. This plasma can enhance either etching or deposition processes. In either case, material deposits on inner surfaces 5 of chamber 3 exhaust port 9 and, potentially, further downstream as in roughing line 19, gate valve 11, and high vacuum pump 13.

A typical prior art cleaning process introduces a cleaning gas into chamber 3 at a location upstream of or approximately equal to the location of wafer chuck 7. Optionally, a plasma may be struck in the region above wafer chuck 7 to enhance the cleaning process. Unfortunately, such a cleaning method is not efficient for the inner surfaces 5 of chamber 3 downstream of wafer chuck 7 or for the inner surfaces of the plasma system 1 downstream of chamber 3, e.g., exhaust port 9, roughing line 19, gate valve 11, and high vacuum pump 13.

In one preferred embodiment, the method of the invention comprises the following steps: introducing a cleaning gas 25 into a plasma process system 1, wherein the process system comprises (i) a process chamber 3 having a wafer chuck 7, inner surfaces 5, and an exhaust port 9 downstream of the wafer chuck 7, and (ii) a vacuum stack 5 downstream of the exhaust port 9, wherein the inner surfaces 5 of the chamber are at least partially covered with a build-up of material; introducing a hot gas 27 into the plasma process system 1 at a point 29A and/or 29B downstream of the wafer chuck 7 and upstream of the gate valve 11, such that the inner surfaces 5 of the process chamber 3 and exhaust port 9, and the deposits thereon, are heated to a higher temperature; allowing the cleaning gas 25 to react with the heated deposits to substantially remove the deposits from the inner surfaces 5 of the process chamber 3 and the exhaust port 9; and optionally; imposing a plasma within the process chamber at a point upstream of, or at, the wafer chuck 7.

The hot gas is typically an inert gas such as argon, neon, helium or xenon. Other gases such as oxygen or nitrogen fluoride may be used. The hot gas is typically heated to a temperature at least 150° C., more preferably at least 150°–400° C. and most preferably at least 150°–600° C. The hot gas is introduced into the plasma process system 1 at a rate of about 10–5000 sccm. This allows the inner surfaces 5 of the process chamber and exhaust port 9 to reach a temperature of 150°–400° C. The hot gas may be introduced at any point downstream of the wafer chuck 7 and upstream of the gate valve 11. Typical locations are point 29A located within chamber 3 and point 29B located in the exhaust port 9. Multiple locations for the introduction of the hot gas are envisioned within the scope of this invention. The amount of the flow of the gas at each of the multiple locations may be tailored to match the amount of deposition at those locations so as to clean the surface efficiently.

In one preferred embodiment of this method, the hot gas and the cleaning gas would be introduced into the chamber 3 with the gate valve 11 closed and roughing valve 21 open. In this embodiment, roughing pump 23 maintains the desired pressure for cleaning, which is typically about 3 torr.

In another embodiment of this invention, the roughing valve 21 is closed and gate valve 11 is open. This embodiment allows the high vacuum pump 13 to be cleaned while maintaining the desired pressure within the process system 1. Care must be exercised when using this option in order to avoid damaging the high vacuum pump by operation at the higher pressure conditions associated with cleaning, e.g., about 3 torr.

In order to provide precise control of the exposure of the high vacuum pump to the cleaning gas and hot gas, one embodiment provides for a modified gate valve blade. As shown in FIG. 2, the modified gate valve blade 50 has at least one orifice 52 therethrough, preferably an array of orifices as shown in FIG. 2. Each orifice is covered by an electromechanical valve. In one embodiment, shown in FIG. 3, the electromechanical valve is a piezoelectric transducer 54. The electromechanical valves operate as check valves that are normally closed when the chamber 3 pressure is above the pressure below the closed gate valve 11 as shown in FIG. 3. As shown in FIG. 3A the piezoelectric transducer 54 seats against gate valve blade 50 and is located on the high pressure (upstream) side of gate valve blade 50. When the piezoelectric transducer is activated as shown in FIG. 3B, the transducer 54 moves away from gate valve blade 50 to create a gap 56 providing access from the high pressure side of gate valve 50 through orifice 52 to the low pressure side of gate valve 50. Orifice 52 and gap 56 may be sized appropriately to permit only a very limited exchange of gas from the high pressure side to the low pressure side. Also, only a few of the orifices may be opened at a given time during the cleaning process to optimize the cleaning process. The location of the orifices which are open may be varied during different steps in the cleaning process.

As shown in FIG. 4, another embodiment of this invention uses a bimetallic valve 60 to cover orifice 52. Again, as shown in FIG. 4A, the bimetallic valve 60 is located on the upstream side of gate valve blade 50 and, when nonactivated, seats against gate valve blade 50 to cover orifice 52. Bimetallic valve 60 comprises a layer of a first metal 62 superimposed over a layer of a second metal 64. When bimetallic valve 60 is activated, one end moves away from gate valve blade 50 to create gap 66 providing access to orifice 52 as shown in FIG. 4B. Again, orifice 52 and gap 66 may be sized to permit only limited transfer of gas from the high pressure side to the low pressure side.

During cleaning, the electromechanical valves covering these orifices 52 could be opened and closed as seen fit to allow atomic fluorine to enter the low vacuum pump region. This could be used to inhibit oxide buildup in the low vacuum pump region.

Returning now to FIG. 1, another embodiment of the invention delivers cleaning gas, and optionally hot gas, into the region of plasma process system 1 downstream from gate valve 11. In this embodiment, a relatively low flow of the associated (atomic) fluorine is delivered either steadily or intermittently in the region directly below the gate valve 11 and above the protective screen 33. This flow of dissociated fluorine can be delivered either before processing, during processing, or after processing, or any combination of the above. The flow must be high enough to effect a cleaning process yet low enough that the input pressure to the low vacuum pump is within normal operating range. Optionally, hot gases may be mixed with the atomic fluorine prior to introduction into plasma process system 1. The atomic fluorine itself may also be preheated after microwave or RF dissociation.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of cleaning a high density plasma system, the method comprising the steps of:

providing a high density plasma system comprising a process chamber having a wafer chuck disposed therein, a flow channel providing fluid communication between the process chamber and a high vacuum pump such that the process chamber and the flow channel are connected to form a continuous inner surface, wherein the flow channel comprises a valve disposed between the process chamber and the high vacuum pump;

introducing a hot gas into the system between the wafer chuck and the valve such that the inner surface between the wafer chuck and the valve is heated; and introducing a cleaning gas into the system such that deposits located on the heated inner surface are substantially removed.

2. The method of claim 1 wherein the valve is a gate valve.

3. The method of claim 1 wherein the hot gas is an inert gas.

4. The method of claim 1 wherein the hot gas has a temperature of between 150° C. and 400° C.

5. The method of claim 1 wherein the inner surface is heated to a temperature of at least 150° C.

6. The method of claim 1 wherein the cleaning gas is a disassociated fluorine containing gas.

7. The method of claim 1 conducted at a pressure of about 3 torr.

8. A method of cleaning a high density plasma system, the method comprising the steps of:
provide a high density plasma system comprising a process chamber having a wafer chuck disposed therein, a flow channel providing fluid communication between the process chamber and a high vacuum pump such that the process chamber and the flow channel are connected to form a continuous inner surface, wherein the flow channel comprises a valve disposed between the process chamber and the high vacuum pump;
introducing a hot gas into the system between the wafer chuck and the valve such that the inner surface between the wafer chuck and the valve is heated; and
introducing a cleaning gas into the system such that deposits located on the heated inner surface are substantially removed, wherein the valve is closed.

9. The method of claim 8 wherein the valve is a gate valve.

10. The method of claim 8 wherein the hot gas is an inert gas.

11. The method of claim 8 wherein the hot gas has a temperature of between 150° C. and 400° C.

12. The method of claim 8 wherein the inner surface is heated to a temperature of at least 150° C.

13. The method of claim 8 wherein the cleaning gas is a disassociated fluorine containing gas.

14. The method of claim 8 conducted at a pressure of about 3 torr.

15. A method of cleaning a high density plasma system, the method comprising the steps of:
providing a high density plasma system comprising a process chamber having a wafer chuck disposed therein, a flow channel providing fluid communication between the process chamber and a high vacuum pump such that the process chamber and the flow channel are connected to form a continuous inner surface, the process chamber being disposed upstream of the high vacuum pump, wherein the flow channel comprises a valve disposed between the process chamber and the high vacuum pump;
closing the valve such that fluid communication between the process chamber and the high vacuum pump is interrupted;
introducing a hot gas into the system between the wafer chuck and the valve such that the inner surface between the wafer chuck and the valve is heated;
introducing a cleaning gas into the system such that deposits located on the heated inner surface are substantially removed;
introducing a cleaning gas into the system downstream of the closed valve such that deposits located on the high vacuum pump are substantially removed.

16. The method of claim 15 wherein the valve is a gate valve.

17. The method of claim 15 wherein the hot gas is an inert gas.

18. The method of claim 15 wherein the hot gas has a temperature of between 150° C. and 400° C.

19. The method of claim 15 wherein the inner surface is heated to a temperature of at least 150° C.

20. The method of claim 15 wherein the cleaning gas is a disassociated fluorine containing gas.

21. The method of claim 15 conducted at a pressure of about 3 torr.

22. The method of claim 15 wherein the cleaning gas is introduced into the system downstream of the closed valve while the high density plasma system is in operation.

23. A method of cleaning a high density plasma system, the method comprising the steps of:
providing a high density plasma system comprising a process chamber having a wafer chuck disposed therein, a flow channel providing fluid communication between the process chamber and a high vacuum pump such that the process chamber and the flow channel are connected to form a continuous inner surface, the process chamber being disposed upstream of the high vacuum pump, wherein the flow channel comprises a valve disposed between the process chamber and the high vacuum pump;
setting the valve in an open position such that fluid communication between the process chamber and the high vacuum pump is permitted;
introducing a hot gas into the system between the wafer chuck and the valve such that the inner surface between the wafer chuck and the valve is heated; and
introducing a cleaning gas into the system such that deposits located on the heated inner surface are substantially removed and deposits located on the high vacuum pump are substantially removed.

24. The method of claim 23 wherein the valve is a gate valve.

25. The method of claim 23 wherein the hot gas is an inert gas.

26. The method of claim 23 wherein the hot gas has a temperature of between 150° C. and 400° C.

27. The method of claim 23 wherein the inner surface is heated to a temperature of at least 150° C.

28. The method of claim 23 wherein the cleaning gas is a disassociated fluorine containing gas.

29. The method of claim 23 conducted at a pressure of about 3 torr.

30. A method of cleaning a high density plasma system, the method comprising the steps of:
providing a high density plasma system comprising a process chamber having a wafer chuck disposed therein, a flow channel providing fluid communication between the process chamber and a high vacuum pump such that the process chamber and the flow channel are connected to form a continuous inner surface, the process chamber being disposed upstream of the high vacuum pump, wherein the flow channel comprises a gate valve disposed between the process chamber and the high vacuum pump, wherein the gate valve has a valve blade comprising at least one orifice having a cover movably attached to the blade upstream of and positioned over the orifice, the cover having an open position permitting fluid communication through the orifice and a closed position preventing fluid communication through the orifice;
closing the valve such that the valve blade interrupts fluid communication between the process chamber and the high vacuum pump;
introducing a hot gas into the system between the wafer chuck and the valve such that the inner surface between the wafer chuck and the valve is heated;
introducing a cleaning gas into the system such that deposits located on the heated inner surface are substantially removed;

positioning the cover into an open position such that the cleaning gas is introduced into the system downstream of the closed valve such that deposits located on the high vacuum pump are substantially removed.

31. The method of claim 30 wherein the valve is a gate valve.

32. The method of claim 30 wherein the hot gas is an inert gas.

33. The method of claim 30 wherein the hot gas has a temperature of between 150° C. and 400° C.

34. The method of claim 30 wherein the inner surface is heated to a temperature of at least 150° C.

35. The method of claim 30 wherein the cleaning gas is a disassociated fluorine containing gas.

36. The method of claim 30 conducted at a pressure of about 3 torr.

37. The method of claim 30 wherein the gate valve comprises multiple orifices having electromechanical valves.

38. The method of claim 30 wherein the electromechanical valve is a piezoelectric valve.

39. The method of claim 30 wherein the electromechanical valve is a bimetallic valve.

40. An apparatus for processing substrates, comprising:
a process chamber having a wafer chuck disposed therein;
a high vacuum pump;
a flow channel providing fluid communication between the process chamber and the high vacuum pump such that the process chamber and the flow channel are connected to form a continuous inner surface, the process chamber being disposed upstream of the high vacuum pump, wherein the flow channel comprises a valve disposed between the process chamber and the high vacuum pump;
a first inlet between the wafer chuck and the valve, the first inlet connected to a source of a hot gas; and
an second inlet connected to a source of a cleaning gas.

41. The apparatus of claim 40 wherein the valve is a gate valve.

42. The apparatus of claim 40 wherein the hot gas is an inert gas.

43. The apparatus of claim 40 wherein the hot gas has a temperature of between 150° C. and 400° C.

44. The apparatus of claim 40 wherein the inner surface is heated to a temperature of at least 150° C.

45. The apparatus of claim 40 wherein the cleaning gas is a disassociated fluorine containing gas.

46. The apparatus of claim 40 conducted at a pressure of about 3 torr.

47. An apparatus for processing substrates, comprising:
a process chamber having a wafer chuck disposed therein;
a high vacuum pump;
a flow channel providing fluid communication between the process chamber and the high vacuum pump such that the process chamber and the flow channel are connected to form a continuous inner surface, the process chamber being disposed upstream of the high vacuum pump, wherein the flow channel comprises a valve disposed between the process chamber and the high vacuum pump;
a first inlet between the wafer chuck and the valve, the first inlet connected to a source of a hot gas;
a second inlet connected to a source of a cleaning gas; and
a third inlet downstream of the valve, the third inlet connected to a source of a cleaning gas.

48. The apparatus of claim 47 wherein the valve is a gate valve.

49. The apparatus of claim 47 wherein the hot gas is an inert gas.

50. The apparatus of claim 47 wherein the hot gas has a temperature of between 150° C. and 400° C.

51. The apparatus of claim 47 wherein the inner surface is heated to a temperature of at least 150° C.

52. The apparatus of claim 47 wherein the cleaning gas is a disassociated fluorine containing gas.

53. The apparatus of claim 47 conducted at a pressure of about 3 torr.

54. The apparatus of claim 47 wherein the cleaning gas is introduced into the system downstream of the closed valve while the high density plasma system is in operation.

55. An apparatus for processing substrates, comprising:
a process chamber having a wafer chuck disposed therein;
a high vacuum pump;
a flow channel providing fluid communication between the process chamber and the high vacuum pump such that the process chamber and the flow channel are connected to form a continuous inner surface, the process chamber being disposed upstream of the high vacuum pump,
a gate valve disposed in the flow channel between the process chamber and the high vacuum pump wherein the gate valve has a valve blade comprising at least one orifice having a cover movably attached to the blade upstream of and positioned over the orifice, the cover having an open position permitting fluid communication through the orifice and a closed position preventing fluid communication through the orifice,
a first inlet between the wafer chuck and the valve, the inlet connected to a source of a hot gas; and
a second inlet connected to a source of a cleaning gas.

56. The apparatus of claim 55 wherein the valve is a gate valve.

57. The apparatus of claim 55 wherein the hot gas is an inert gas.

58. The apparatus of claim 55 wherein the hot gas has a temperature of between 150° C. and 400° C.

59. The apparatus of claim 55 wherein the inner surface is heated to a temperature of at least 150° C.

60. The apparatus of claim 55 wherein the cleaning gas is a disassociated fluorine containing gas.

61. The apparatus of claim 55 conducted at a pressure of about 3 torr.

62. The apparatus of claim 55 wherein the gate valve comprises multiple orifices having electromechanical valves.

63. The apparatus of claim 55 wherein the electromechanical valve is a piezoelectric valve.

64. The apparatus of claim 55 wherein the electromechanical valve is a bimetallic valve.

* * * * *